(12) United States Patent
Dawson et al.

(10) Patent No.: US 6,661,057 B1
(45) Date of Patent: *Dec. 9, 2003

(54) TRI-LEVEL SEGMENTED CONTROL TRANSISTOR AND FABRICATION METHOD

(76) Inventors: Robert Dawson, 3504 Beartree Cir., Austin, TX (US) 78730; Mark I. Gardner, P.O. Box 249, Hwy. 535, Cedar Creek, TX (US) 78612; Frederick N. Hause, 4702 Cir. Oak Cove, Austin, TX (US) 78749; H. Jim Fulford, Jr., 9808 Woodshire Dr., Austin, TX (US) 78748; Mark W. Michael, 1805 Dayflower Trace, Cedar Park, TX (US) 78613; Bradley T. Moore, 1502 Johnny Miller Trail, Austin, TX (US) 78746; Derick J. Wristers, 1904 Terish Cove, Austin, TX (US) 78728

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/056,836

(22) Filed: Apr. 7, 1998

(51) Int. Cl.[7] ............................................. H01L 27/088
(52) U.S. Cl. .................. 257/336; 257/344; 257/408; 257/900; 438/306
(58) Field of Search ................... 257/408, 344, 257/336, 900; 438/306

(56) References Cited

U.S. PATENT DOCUMENTS

| | | | | |
|---|---|---|---|---|
| 4,868,617 A | * | 9/1989 | Chiao et al. | 357/23.3 |
| 4,951,100 A | * | 8/1990 | Parillo | 357/23.3 |
| 5,091,763 A | * | 2/1992 | Sanchez | 357/23.9 |
| 5,274,261 A | * | 12/1993 | Chen | 257/344 |
| 5,510,648 A | * | 4/1996 | Davies et al. | 257/657 |
| 5,543,643 A | * | 8/1996 | Kapoor | 257/262 |
| 5,793,089 A | * | 8/1998 | Fulford, Jr. et al. | 257/408 |
| 5,808,347 A | * | 9/1998 | Kurimoto et al. | 257/408 |
| 5,831,319 A | * | 11/1998 | Pan | 257/408 |

* cited by examiner

Primary Examiner—William Mintel

(57) ABSTRACT

A transistor is formed in an active area having a segmented gate structure. The segmented gate structure advantageously provides for dynamic control of a channel region formed within the transistor. Lightly doped source and drain (LDD) regions are formed aligned to a gate electrode. After forming an insulating layer adjacent the exposed surfaces of the gate electrode, conductive spacers are formed disposed overlying the LDD regions. These spacers are electrically isolated from the gate electrode by the insulating layer. Heavily doped source and drain (S/D) regions are formed which are aligned to the spacers and make electrical contact, for example through a salicide process, supplied to the conductive spacer, the gate electrode, and the S/D regions. The described structure advantageously supplies dynamic control of the channel region through dynamic, independent control of the LDD portions of the S/D regions.

15 Claims, 6 Drawing Sheets

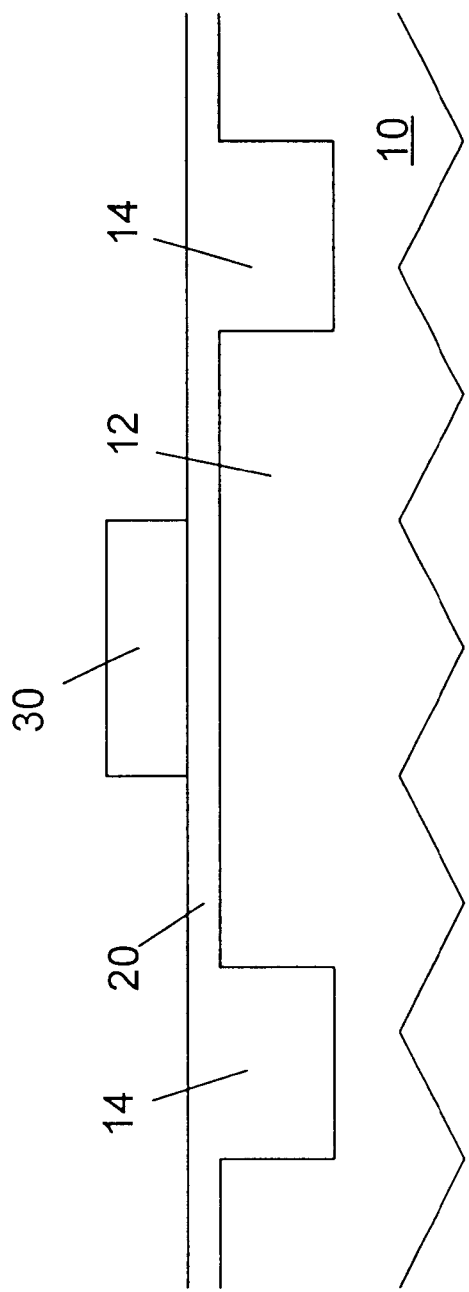

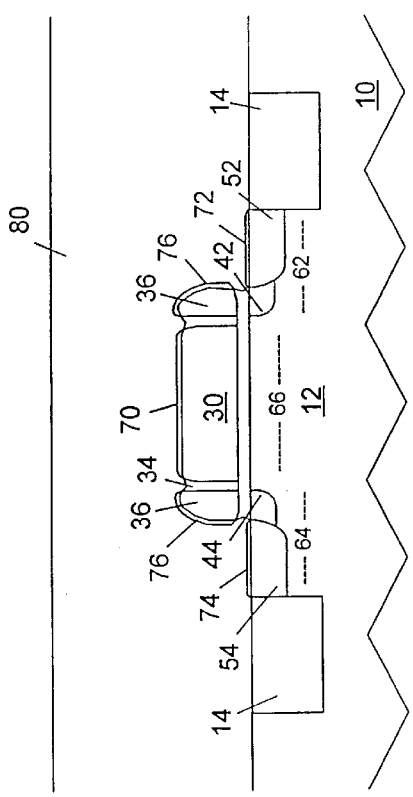
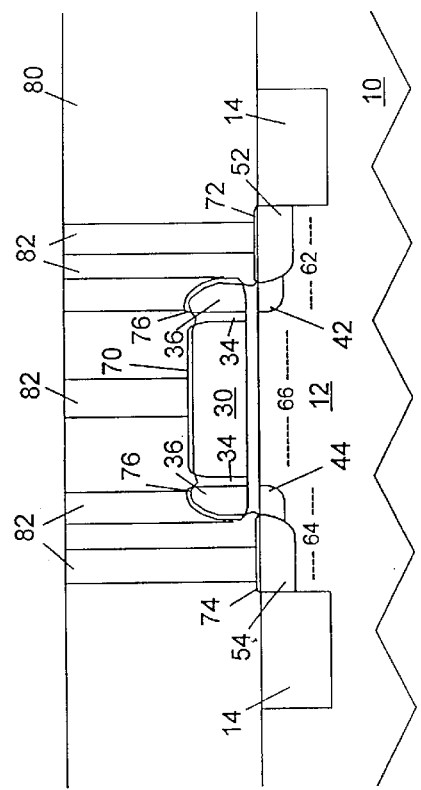

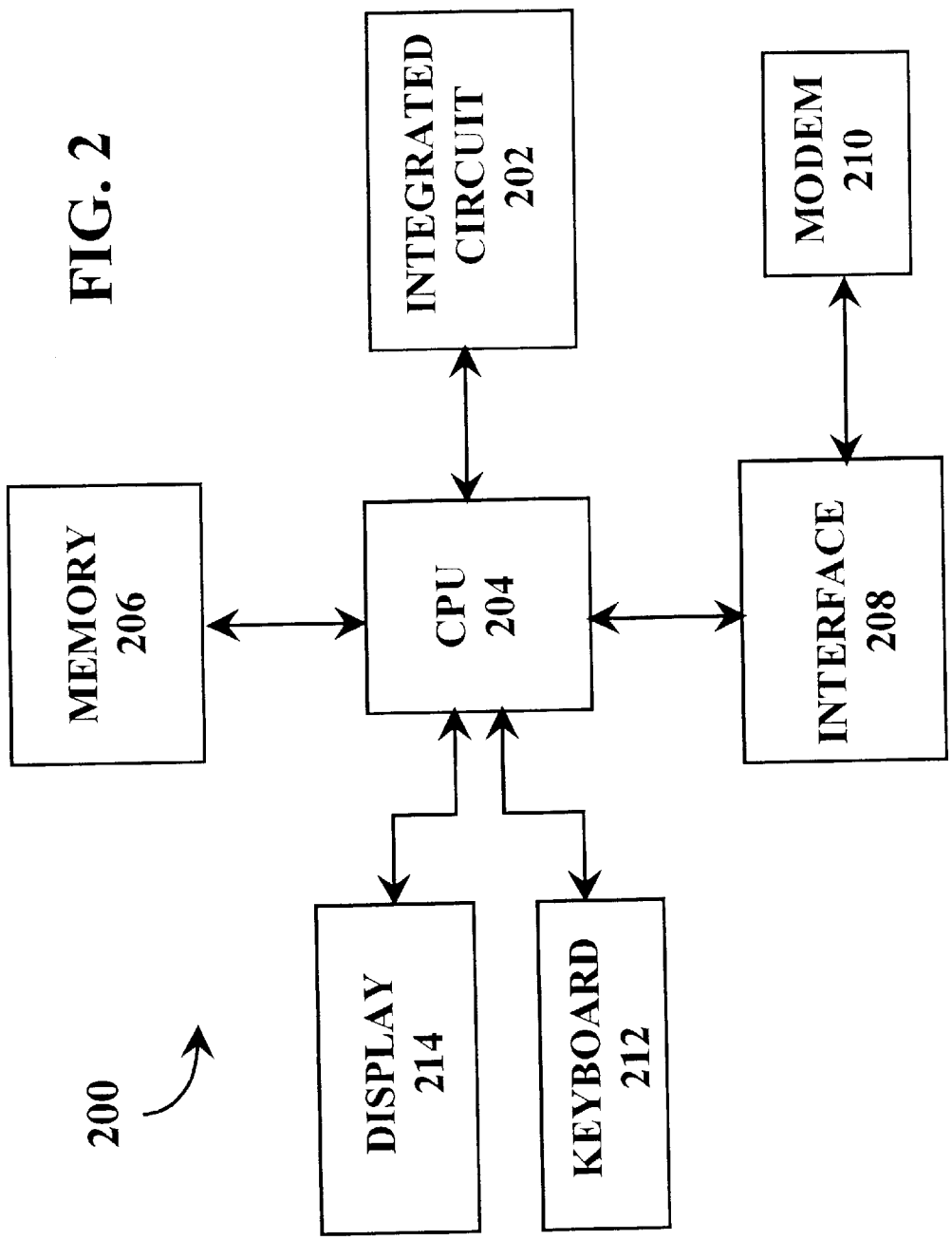

TRI-LEVEL SEGMENTED CONTROL TRANSISTOR AND FABRICATION METHOD

BACKGROUND OF THE INVENTION

1. Field of the Invention

The present invention relates in general to semiconductor integrated circuit device structures and associated methods of fabrication. More particularly, the invention pertains to tri-level control transistors having segmented control gates.

2. Description of Related Art

An insulated-gate field-effect transistor (IGFET), such as a metal-oxide semiconductor field-effect transistor (MOSFET), uses a gate electrode to control an underlying surface channel joining a source and a drain. The channel, source and drain are located in a semiconductor substrate, with the channel being doped with a conductivity type opposite the conductivity type of the source and drain. The gate electrode is separated from the semiconductor substrate by a thin insulating layer such as a gate oxide. The operation of the IGFET involves application of an input voltage to the gate electrode, which sets up a transverse electric field in the channel in order to modulate the longitudinal conductance of the channel.

In typical IGFET processing, the source and drain are formed by introducing dopants of a second conductivity type (P or N) into the semiconductor substrate of a first conductivity type (N or P) using a patterned gate electrode as a mask. This self-aligning procedure tends to improve packing density and reduce parasitic overlap capacitances between the gate electrode and the source/drain regions.

Polysilicon (also called polycrystalline silicon, polysilicon-Si or polysilicon) thin films have many important uses in IGFET technology. One of the key innovations is the use of heavily doped polysilicon as the gate electrode in place of aluminum. Since polysilicon has the same high melting point as a silicon substrate, it can be deposited prior to source and drain formation, and serve as a mask during introduction of the source and drain regions by ion implantation. The resistance of polysilicon can be further reduced by forming a silicide on its top surface.

There is a relentless trend to miniaturize semiconductor dimensions. The number of IGFETs that can be manufactured on an integrated circuit chip can be increased by decreasing the horizontal dimensions. Resolution refers to the horizontal linewidth or space that a lithographic system can adequately print or resolve. Lithographic systems include optical projection and step and repeat equipment, and electron beam lithography equipment. In optical systems, for instance, resolution is limited by the equipment (e.g., diffraction of light, lens aberrations, mechanical stability), optical properties of the photoresist (e.g., resolution, photosensitivity, index of refraction), and process characteristics (e.g., softbake step, develop step, postbake step, and etching step).

Furthermore, scaling down the horizontal dimensions generally is attained by a corresponding decrease in the vertical dimensions. As IGFET vertical dimensions are reduced and the supply voltage remains nearly constant (e.g., 3V), the maximum channel electric field $\epsilon_{ymax}$ near the drain tends to increase. If the electric field becomes strong enough, so-called hot-carrier effects may occur. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). The LDD reduces hot carrier effects by reducing the maximum channel electric field $\epsilon_{ymax}$. Reducing the electric field on the order of 30–40% can reduce hot-electron-induced currents by several orders of magnitude. The drain is typically formed by two ion implants. A light implant is self-aligned to the gate electrode, and a heavy implant is self-aligned to the gate electrode on which sidewall spacers have been formed. The spacers are typically oxides or nitrides. The purpose of the lighter first dose is to form a lightly doped region of the drain (or LDD) at the edge near the channel. The second heavier dose forms a low resistivity region of the drain, which is subsequently merged with the lightly doped region. Since the heavily doped region is farther away from the channel than a conventional drain structure, the depth of the heavily doped region can be made somewhat greater without adversely affecting the device characteristics. The lightly doped region is not necessary for the source (unless bidirectional current is used), however LDD structures are typically formed for both the source and drain to avoid the need for an additional masking step.

Disadvantages of LDDs are their increased fabrication complexity compared to conventional drain structures, and parasitic resistance. LDDs exhibit relatively high parasitic resistance due to their light doping levels. During operation, the LDD parasitic resistance can decrease drain current, which in turn may reduce the speed of the IGFET.

In the manufacture of integrated circuits, the planarization of semiconductor wafers is becoming increasingly important as the number of layers used to form integrated circuits increases. For instance, the gate electrode and/or metallization layers formed to provide interconnects between various devices may result in nonuniform surfaces. The surface nonuniformities may interfere with the optical resolution of subsequent lithographic steps, leading to difficulty with printing high resolution patterns. The surface nonuniformities may also interfere with step coverage of subsequently deposited metal layers and possibly cause open circuits.

Accordingly, a need exists for an IGFET that can be manufactured with reduced horizontal dimensions, that preferably includes an LDD with reduced parasitic resistance as well as a substantially planar top surface. It is especially desirable that the IGFET have a channel length that can be significantly smaller than the minimum resolution of the available lithographic system.

SUMMARY OF THE INVENTION

A transistor is formed in an active area having a segmented gate structure. The segmented gate structure advantageously provides for dynamic control of a channel region formed within the transistor.

In accordance with an embodiment of a method for fabricating a transistor, lightly doped source and drain (LDD) regions are formed aligned to a gate electrode. After forming an insulating layer adjacent the exposed surfaces of the gate electrode, conductive spacers are formed disposed overlying the LDD regions. These spacers are electrically isolated from the gate electrode by the insulating layer. Heavily doped source and drain (S/D) regions are formed which are aligned to the spacers and make electrical contact, for example through a salicide process, supplied to the conductive spacer, the gate electrode, and the S/D regions.

The described structure advantageously supplies dynamic control of the channel region through dynamic, independent control of the LDD portions of the S/D regions.

In some embodiments, the tri-level control transistors are controlled to have a gate electrode modify the drain potential of a transistor. In still other embodiments, the tri-level control transistors allow independent bias of the main gate electrode and source/drain regions. Independently biasing the gate electrode and source/drain regions permits precise control of transistor performance to improve transistor reliability and enhance operating speed.

Many advantages are attained by the described semiconductor integrated circuit and associated fabrication method. The semiconductor integrated circuit attains a reduced surface area through active area isolation by shallow trench isolation (STI) and electrical contacts formed to S/D regions within the STI region.

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings. For ease of understanding and simplicity, common numbering of elements within the illustrations is employed where the element is the same between illustrations.

FIGS. 1A, 1B, 1C, 1D, 1E, 1F, 1G, and 1H are simplified cross-sectional views of embodiments at a plurality of steps in a fabrication process.

FIG. 2 is a schematic block diagram illustrating a computer system including an integrated circuit including vertical transistors with spacer gates fabricated using a method as depicted in FIGS. 1A through 1H.

DETAILED DESCRIPTION OF THE ILLUSTRATIVE EMBODIMENTS

Figure 1B:
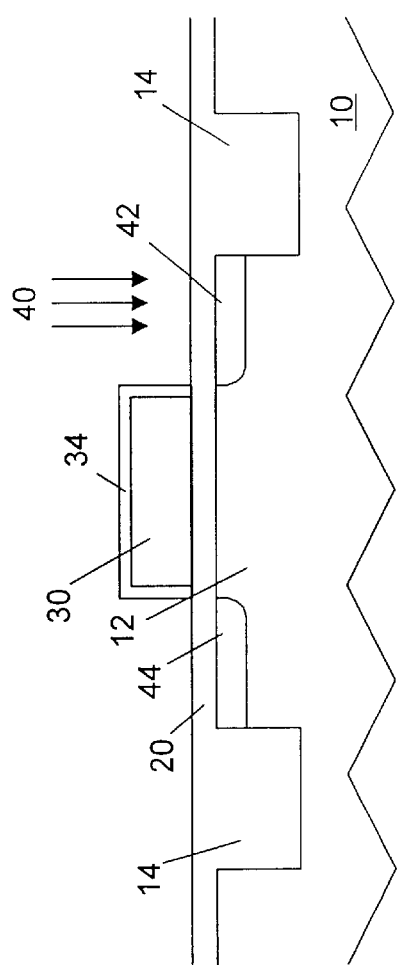

Embodiments of the present invention are described with reference to the aforementioned figures. These drawings are simplified for ease of understanding and description of embodiments. Various modifications or adaptations of specific methods and or structures may become apparent to those skilled in the art. Various suitable modifications, adaptations or variations that rely upon the disclosure herein, and through which these teachings have advanced the art, are considered to be within the spirit and scope of the present invention. For example, referring to FIGS. 1A through 1H, while substrate 10 is shown with a minimum of detail for ease of understanding, typically substrate 10 is tailored to maximize the yield and performance of semiconductor circuitry formed therein. Therefore, while in some embodiments of the present invention substrate or wafer 10 is a silicon wafer as is depicted in FIG. 1A, in other embodiments substrate 10 has an epitaxial silicon layer disposed thereon and in still other embodiments substrate 10 is a silicon bonded wafer structure such as used for fabrication of Silicon On Insulator (SOI) circuits. Thus, substrate 10 can be any structure known to those of ordinary skill in the art to be suitable for semiconductor device fabrication.

Referring to FIG. 1A, an early step in the fabrication of a semiconductor device is depicted. Semiconductor substrate or wafer 10 has isolation regions 14 formed in the substrate 10. Isolation regions 14 are depicted as being formed using a Shallow Trench Isolation (STI) technique. However, in other embodiments other isolation schemes, such as any of the LOCalized Oxidation of Silicon (LOCOS) schemes, are employed. While isolation regions 14 appear in FIG. 1A as two distinct regions, other views and other embodiments may have a different structure. For example, the appearance result from the particular cross-sectional view employed. In addition, in some embodiments more than one type of isolation scheme can be used to form active area region 12. Thus the nature of the isolation structure selected is a design choice, and any such design choice is meant to fall within the scope and spirit of the present disclosure.

The active area region 12 is depicted in FIG. 1A between and adjacent to the two isolation regions 14. Gate dielectric layer 20 is formed overlying wafer 10 in general and active area 12 specifically. The gate oxide layer 20 is typically a silicon dioxide (oxide) layer that is formed by a thermal oxidation process using a known suitable thermal oxidation processes. In some embodiments other materials, such as oxynitrides and nitrogen ($N_2$) bearing oxides, are employed to form gate dielectric 20. The thickness for the gate oxide layer 20 is chosen based on the gate material and the specific application for the device. For example, a silicon dioxide gate oxide layer 20 typically has a thickness in a range between approximately 25 Å and 250 Å. Once the gate oxide layer 20 is formed, a gate electrode 30 is fabricated using a known suitable fabrication method. Typically, the gate electrode 30 is formed by deposition and a pattern and etch process. First, a polysilicon layer (not shown) with a thickness of between approximately 1000 Å and 3000 Å is deposited using a deposition process such as a low pressure Chemical Vapor Deposition (LPCVD) process. A photoresist layer (not shown) is patterned and used as an etch mask for an RIE etch process that forms the electrode 30. While the specified thickness range for the gate electrode 30 is desirable, other thicknesses outside the specified range may also be appropriate. The choice of a thickness for the gate electrode 30 is a design choice from among known suitable choices.

Referring to FIG. 1B, the gate electrode 30 is oxidized to form an isolation layer 34. An implant operation forms lightly doped source and drain (LDD) regions 42 and 44, respectively. The isolation layer 34 is typically a silicon dioxide layer, approximately 50 Å to 1000 Å or greater in thickness, and is formed by thermal oxidation of a portion of polysilicon gate electrode 30. However, the gate electrode layer 30 may otherwise be formed using a deposition process that results in a conformal silicon oxide film, or using a combination of oxidation and deposition processes. The isolation layer 34 supplies electrical isolation between the gate electrode 30 and segmented gate portions shown in FIG. 1C that are formed in subsequent process steps. The thickness and physical integrity of layer 34 determine the performance of the device. In addition, the thickness of isolation layer 34 is a factor in successfully employing a subsequent salicide process (see FIG. 1E) for electrical contact to each gate segment.

LDD regions 42 and 44 are typically formed using an ion implant 40 process. If the active area 12 is formed in P-type silicon, the ion implant 40 operation forms N-type regions 42 and 44. If the active area 12 is formed in N-type doped silicon, the ion implant 40 operation forms P-type regions 42 and 44. The specific N and P-type dopants that are selected are not essential to fabrication of described embodiments. Design choices may be made from among known suitable dopants.

Figure 1C:
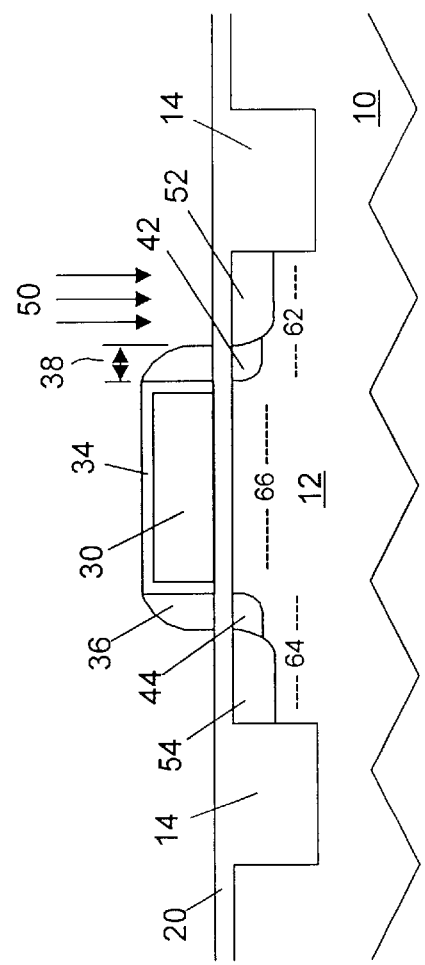

Referring now to FIG. 1C, polysilicon spacers 36 are shown formed adjacent isolation layer 34, and implant 50 is shown forming heavily doped regions 52 and 54. Once formed, heavily doped regions 52 and 54 combine with LDD regions 42 and 44 to form S/D regions 62 and 64 respectively. In addition, S/D regions 62 and 64 define transistor channel region 66 as indicated.

Techniques for the formation of spacers, such as dielectric spacers and polysilicon spacers, adjacent a gate electrode are well known. Although the polysilicon spacers 36 of the illustrative embodiment are not dielectric, the basic process sequence employed for spacer formation is essentially unchanged from the process for forming dielectric spacers. In particular, a second polysilicon layer (not shown) having a predetermined thickness is deposited overlying the device structure shown in FIG. 1B. The overlying polysilicon layer etched back to form the polysilicon spacers 36 typically having a width 38 slightly less than the thickness of the second polysilicon layer. In the illustrative embodiment, the polysilicon spacers 36 are formed to dynamically control the profile of a channel 66. The width of the polysilicon spacers 36 is to be sufficient to achieve a desired amount of dynamic control.

Dynamic channel control is achieved through biasing voltages applied to electrical contacts to the polysilicon spacers 36. The width 38 of the polysilicon spacers 36 is set to a sufficient dimension to supply a suitable electrical contact. Typically, the minimum dimension for width 38 is determined by the minimum contact geometry or the minimum overlay capability of the lithography equipment. The determination of width 38 and thicknesses that are suitable for the second polysilicon layer depends both on the desired amount of dynamic channel control and the process design rules for the fabrication process.

Figure 1D:
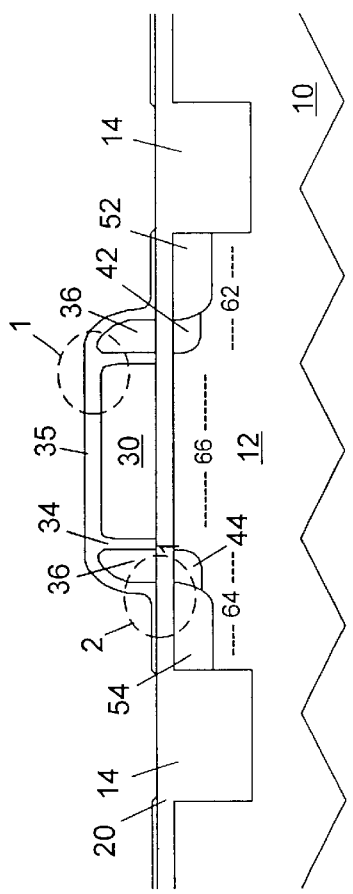

Referring to FIG. 1D, a semiconductor device is depicted during fabrication following an optional oxide strip and reoxidation step. The oxide strip operation is typically performed using a short wet etch process in a buffered HF solution so that all of the silicon oxide overlying the gate electrode 30 and doped regions 52 and 54 is removed. The wet etch process does not remove the isolation layer 34 between the gate electrode 30 and the polysilicon spacers 36, and does not remove the portion of the gate oxide layer 20 underlying the gate electrode 30 and the polysilicon spacers 36.

The reoxidation operation grows an oxide layer 35 on the polysilicon spacers 36 and the gate electrode 30. In addition, the reoxidation operation increases the spacing between the polysilicon spacers 36 and the gate electrode 30 indicated in a highlighted area 1. The reoxidation operation also increases the spacing between the polysilicon spacers 36 and the wafer 10 indicated in highlighted area 2.

The mechanism of the increase in spacing in the highlighted areas is not critical to the practice of described embodiments. However, the increase in spacing is conjectured to result from oxygen diffusion through the silicon oxide of layer 34 and the gate oxide layer 20 in a manner similar to the diffusion that occurs in LOCOS isolation schemes, producing the "bird's beaks" characteristic of LOCOS schemes.

Figure 1E:
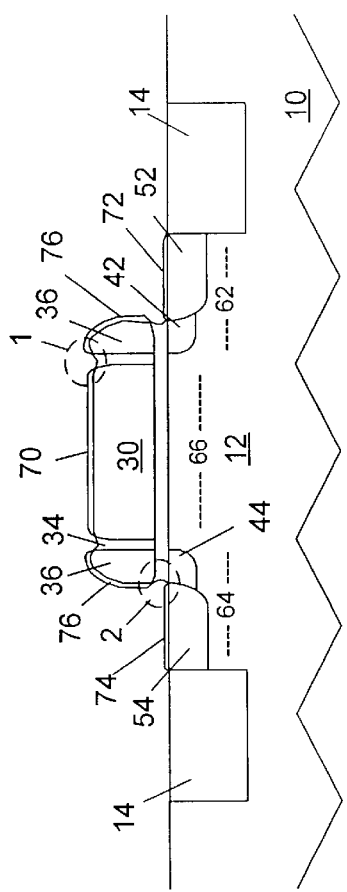

Referring to FIG. 1E, source/drain (S/D) silicide contact regions 72 and 74 are shown overlying a portion of S/D regions 52 and 54, respectively. A gate silicide contact region 70 overlies the gate electrode 30 and a spacer silicide contact region 76 overlies each polysilicon spacer 36. In some embodiments, the silicide contact regions are formed by a salicide process. A salicide is a self-aligned silicide. A metal that reacts with silicon to form a metal silicide is deposited over the entire surface of the wafer 10. The wafer 10 is then heated to a temperature sufficient to induce the metal-silicon reaction such that only the metal in contact with silicon reacts to form the metal silicide. Metal that is not in contact with silicon remains unreacted and is removed without affecting the metal silicide regions. In this manner, the exposed silicon pattern is precisely reproduced in metal silicide and is self-aligned to the silicon pattern. However, the salicide process utilizes a minimum separation between regions of exposed silicon to be effective. The minimum separation distance, while depending on a variety of factors such as the specific metal selected, reaction time, and temperature, is often in the range of approximately 50 nm. While titanium (Ti) is a suitable choice for the salicide process, other metals, for example metals included in Group VIII of the Periodic Table, are alternate choices from among known suitable choices.

The described optional reoxidation step is not necessary to realize the advantages of the described embodiments. In some embodiments, the spacing for a salicide process to form contact regions 70, 72, 74 and 76 is determined by choosing an appropriate thickness for the gate oxide layer 20 and the isolation layer 34. In other embodiments, an oxidation of the structure depicted in FIG. 1C is performed without initially removing exposed portions of layers 20 and 34. Alternatively, contact regions 70, 72, 74 and 76 are formed using a photolithographic and etch process to define contact openings (not shown) in an overlying silicon oxide layer.

Referring to FIG. 1F, a blanket layer of silicon oxide ($SiO_2$) 80 is formed over the substrate 10 and covers the gate electrode 30 and the polysilicon spacers 36 of the semiconductor device. The oxide layer 80 with a thickness in the range of 5000 Å to 20000 Å is conformally deposited over the substrate 10 by chemical vapor deposition (CVD) or plasma-enhanced chemical vapor deposition (PECVD) at a temperature in the range of 300° C. to 400° C. Deposition is followed by a chemical-mechanical polish (CMP) operation to planarize the substrate surface.

Referring to FIG. 1G, a contact via-defining photoresist mask is patterned over the oxide layer 80. The contact via-defining photoresist mask is deposited in a continuous layer on the oxide layer 80 and irradiated using the photolithographic system to form a predefined two-dimensional image pattern on the horizontal planar surface of the oxide layer 80. The contact via-defining photoresist mask defines a plurality of contact vias 82 for accessing and forming electrical connections to selected regions of the semiconductor device through the oxide layer 80. In the illustrative embodiment, contact vias 82 are formed for contacting the gate electrode 30 and the polysilicon spacers 36 through the oxide layer from an interconnect layer (not shown). The contact via-defining photoresist mask is developed and irradiated portions of the mask are removed to expose the oxide layer 80 overlying the prospective locations of the contact vias 82. In the illustrative embodiment, the contact via-defining photoresist mask forms some contact vias 82 that extend essentially across that lateral dimension of a spacer and other contact vias extending over a portion of the gate electrode 30.

The oxide layer 80 is etched using a reactive ion etch (RIE) that etches the contact vias 82 to the surface of the substrate 10. The reactive ion etch (RIE) etches the oxide layer 80 and portions of the polysilicon spacers 36 that are exposed by the contact via-defining photoresist mask.

Figure 1H:
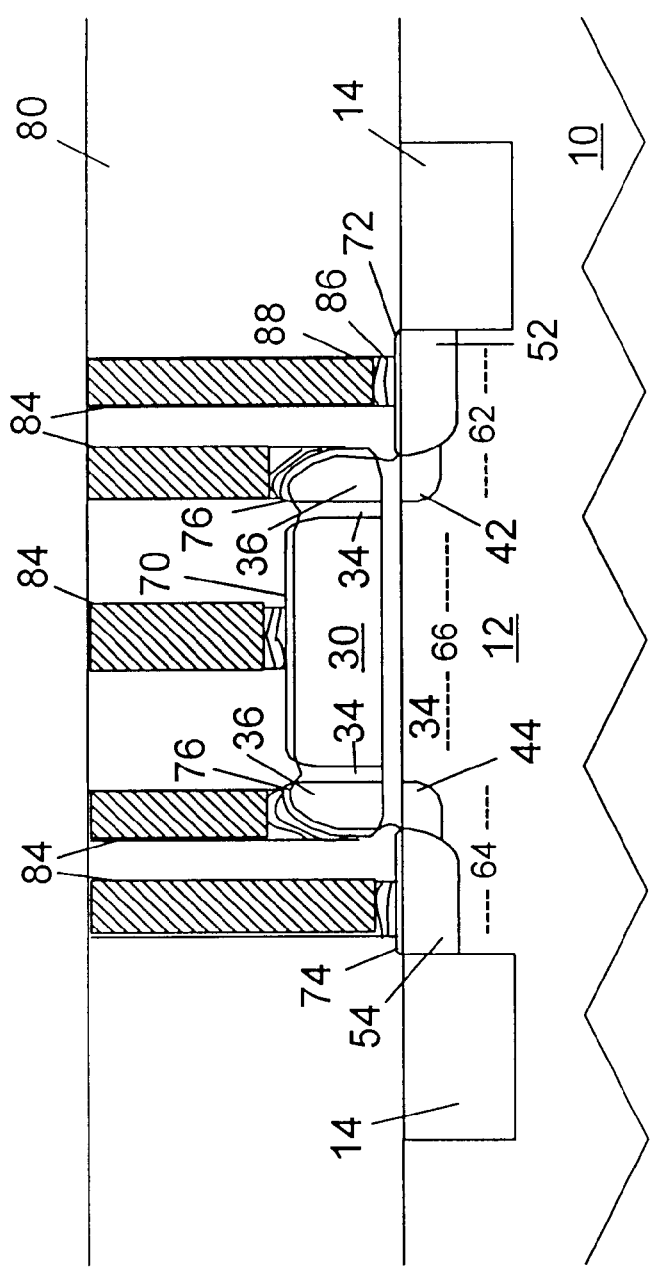

Referring to FIG. 1H, metal interconnects 84 form electrical connections to the gate electrode 30, the polysilicon spacers 36, and the S/D regions 80 with the metal serving as a conductor. The metal interconnects 84 are connected to interconnect structures (not shown) in an interconnect layer overlying the oxide layer 80 to form a connection to an interconnect structure selectively connecting multiple transistors including biasing connections to the conductive polysilicon spacers 36. In an illustrative embodiment, the metal interconnects 84 are formed by first depositing a titanium sacrificial barrier 86 into the contact vias 82 in contact with the gate electrode 30, the polysilicon spacers 36, and the S/D regions 52, 54 of the substrate 10. Titanium films are used as a diffusion barrier since titanium (Ti) is an oxygen-gettering material and oxide-reducing agent. Accordingly, titanium dissolves a native oxide layer on the silicon surface of the gate electrode 30, the polysilicon spacers 36, and the S/D regions 52, 54 during annealing and adheres well to both silicon and oxide ($SiO_2$). In addition, titanium forms good ohmic contacts to heavily-doped silicon whether the doping is N-type doping or P-type doping. The illustrative structure advantageously facilitates circuit arrangements in which the sources of two or more transistors are connected.

In the illustrative embodiment, the metal interconnects 84 form a tungsten (W) interconnect. The titanium sacrificial barrier 86 between the polysilicon of the gate electrode 30, the polysilicon spacers 36, and the S/D regions 52, 54 of the substrate 10 and the tungsten metal interconnects 84 function as a sacrificial barrier through the reaction of titanium with silicon to form titanium-silicide. The titanium sacrificial barrier 86 is formed by depositing a very thin layer of titanium onto the gate electrode 30, the polysilicon spacers 36, and the substrate 10 including deposition into the contact vias 82. The wafer 10 is annealed to react the titanium with the silicon in the undoped polysilicon, thereby forming $TiSi_2$. The titanium is deposited as a very thin layer to avoid absorption of dopants from undoped polysilicon during formation of $TiSi_2$.

Following the formation of the titanium sacrificial barrier 86, a titanium nitride (TiN) passive barrier 88 is formed over the titanium sacrificial barrier 86. The TiN passive barrier 88 serves as a contact diffusion barrier in silicon integrated circuits by operating as an impermeable barrier to silicon and by virtue of a high activation energy for the diffusion of other impurities. TiN has a high thermodynamic stability and a relatively low electrical resistivity of transition metal carbides, borides or nitrides. The TiN passive barrier 88 is formed using one of multiple techniques. For example, the TiN passive barrier 88 is formed by: (1) evaporating titanium in a nitrogen ($N_2$) ambient, (2) reactively sputtering the titanium in an argon (Ar)-nitrogen ($N_2$) mixture, (3) sputtering from a TiN target in an inert argon ambient, (4) sputter depositing titanium in an argon (Ar) ambient and converting the titanium to TiN is a separate plasma nitridation step, or (5) chemical vapor deposition (CVD).

The tungsten metal interconnects 84 are formed by chemical vapor deposition (CVD) of tungsten in a low pressure CVD reactor. Typically tungsten hexafluoride $WF_6$ used as a source gas for reduction by hydrogen or silicon in a two-step process. In a first step, the tungsten source is reduced by silicon typically from silane ($SiH_4$) or dichlorosilane ($SiCl_2H_2$) to form a layer of tungsten approximately 100 Å thick. In a second step, hydrogen $H_2$ reduction is performed to deposit additional tungsten only on the tungsten layer formed in the first step. The metal interconnects 84 are formed in the contact vias 82 over the titanium sacrificial barrier 86 and the TiN passive barrier 88 by silicon reduction of tungsten hexafluoride $WF_6$ leaving solid tungsten, silicon fluoride vapor, and sometimes hydrogen fluoride vapor.

Once the metal interconnects 84 are formed, chemical-mechanical polishing (CMP) is used to planarize the oxide and metal surface overlying the substrate 10. CMP creates a smooth, planar surface for intermediate processing steps of an integrated circuit fabrication process and removes undesirable residues that remain from other substrate processing steps. CMP involves simultaneous chemically etching and mechanical polishing or grinding of a surface so that a combined chemical reaction and mechanical polishing removes a desired material from the substrate surface in a controlled manner. The resulting structure is a planarized substrate surface with any protruding surface topography leveled. CMP is typically performed by polishing a substrate surface against a polishing pad that is wetted with a slurry including an acidic or basic solution, an abrasive agent and a suspension fluid.

The metal interconnects 84 may be formed of metals other than tungsten. Tungsten advantageously tolerates high temperatures that occur during annealing.

Referring to FIG. 2, a computer system 200 includes an integrated circuit 202, a central processing unit 204, a memory 206, and an interface 208, and sometimes connected to a modem 210. The computer system 200 also includes a keyboard 212 and a display 214 forming a user interface.

While the invention has been described with reference to various embodiments, the embodiments are illustrative and that the scope of the invention is not limited to them. Many variations, modifications, additions and improvements of the embodiments described are possible. For example, those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. An integrated circuit comprising:

a substrate wafer;

a gate insulating layer formed on a surface of the substrate wafer;

a gate electrode formed on the gate insulating layer over the surface of the substrate wafer, the gate electrode having lateral sidewall surfaces;

a lightly-doped drain region doped into the substrate wafer self-aligned with the gate electrode;

an insulating dielectric layer formed on the lateral sidewall surfaces of the gate electrode;

spacers formed of a conductive material formed on the sidewall surfaces of the gate electrode, the spacers being electrically isolated from the gate electrode by the insulating dielectric layer and electrically isolated from the active region of the substrate wafer by the gate insulating layer;

an insulating layer formed on the substrate wafer overlying the gate electrode and the spacers, the insulating layer having a via extending through the insulating layer to a biasing spacer of the spacers;

a metal silicide layer formed on the gate electrode and formed on the spacers underlying the insulating layer, wherein the metal silicide layer formed on the gate electrode is separated by a minimum separation distance from the metal silicide layer formed on the spacers; and a conductor formed in the via extending through the insulating layer, the conductor for dynamically applying a biasing voltage to the biasing spacer for controlling voltage in the lightly-doped drain region.

2. An integrated circuit according to claim 1, further comprising:

a doped source region and doped drain region having a doping concentration higher than the lightly-doped drain region, the doped source region and the doped drain region being self-aligned with the gate electrode and the spacers.

3. An integrated circuit according to claim 1, further comprising:

the insulating layer having a via extending through the insulating layer to the gate electrode; and a conductor formed in the via extending through the insulating layer and contacting the gate electrode.

4. An integrated circuit according to claim 1 further comprising:

a plurality of vias formed in the insulating layer and extending through the insulating layer to the spacers;

a plurality of conductors formed in the vias extending through the insulating layer and connecting the spacers to external conductors for independently controlling bias of the lightly-doped drain.

5. An integrated circuit according to claim 3, wherein:

the gate electrode is a polysilicon gate electrode;

the spacers are polysilicon spacers; and the silicide formed on the polysilicon gate electrode and on the polysilicon spacers is titanium silicide.

6. An integrated circuit according to claim 1, wherein:

the gate electrode is a polysilicon gate electrode; and the spacers are polysilicon spacers.

7. An integrated circuit chip including an integrated circuit comprising:

a substrate wafer;

a gate insulating layer formed on a surface of the substrate wafer;

a gate electrode formed on the gate insulating layer over the surface of the substrate wafer, the gate electrode having lateral sidewall surfaces;

a lightly-doped drain region doped into the substrate wafer self-aligned with the gate electrode;

an insulating dielectric layer formed on the lateral sidewall surfaces of the gate electrode;

spacers formed of a conductive material formed on the sidewall surfaces of the gate electrode, the spacers being electrically isolated from the gate electrode by the insulating dielectric layer and electrically isolated from the active region of the substrate wafer by the gate insulating layer;

an insulating layer formed on the substrate wafer overlying the gate electrode and the spacers, the insulating layer having a via extending through the insulating layer to a biasing spacer of the spacers;

a metal silicide layer formed on the gate electrode and formed on the spacers underlying the insulating layer, wherein the metal silicide layer formed on the gate electrode is separated by a minimum separation distance from the metal silicide layer formed on the spacers; and a conductor formed in the via extending through the insulating layer, the conductor for dynamically applying a biasing voltage to the biasing spacer for controlling voltage in the lightly-doped drain region.

8. An integrated circuit comprising:

a substrate wafer having an active region doped with impurities of a first conductivity type;

a gate insulating layer formed on a surface of the substrate wafer;

a gate electrode formed on the gate insulating layer over the surface of the substrate wafer, the gate electrode having lateral sidewall surfaces;

a lightly doped source region and a lightly doped drain region, the lightly doped regions being doped with impurities of a second conductivity type opposite in conductivity to the first conductivity type and formed in the active region of the substrate wafer, self-aligned with the gate electrode;

an insulating dielectric layer formed on the lateral sidewall surfaces of the gate electrode;

spacers formed of a conductive material formed on the sidewall surfaces of the gate electrode, the spacers being electrically isolated from the gate electrode by the insulating dielectric layer and electrically isolated from the active region of the substrate wafer by the gate insulating layer;

a doped source region and doped drain region having a doping concentration higher than the lightly-doped source region and the lightly-doped drain region, the doped source region and the doped drain region being self-aligned with the gate electrode and the spacers;

an insulating layer formed on the substrate wafer overlying the gate electrode and the spacers, the insulating layer having a via extending through the insulating layer to a biasing spacer of the spacers;

a metal silicide layer formed on the gate electrode and formed on the spacers underlying the insulating layer, wherein the metal silicide layer formed on the gate electrode is separated by a minimum separation distance from the metal silicide layer formed on the spacers; and a conductor formed in the via extending through the insulating layer, the conductor for dynamically applying a biasing voltage to the biasing spacer for controlling voltage in the lightly-doped drain region.

9. An integrated circuit according to claim 8, further comprising:

the insulating layer having a via extending through the insulating layer to the gate electrode; and a conductor formed in the via extending through the insulating layer and contacting the gate electrode.

10. An integrated circuit according to claim 8 further comprising:

a plurality of vias formed in the insulating layer and extending through the insulating layer to the spacers;

a plurality of conductors formed in the vias extending through the insulating layer and connecting the spacers to external conductors for independently controlling bias of the lightly-doped drain.

11. An integrated circuit according to claim 9, wherein:

the gate electrode is a polysilicon gate electrode;

the spacers are polysilicon spacers; and the silicide formed on the polysilicon gate electrode and on the polysilicon spacers is titanium silicide.

12. An integrated circuit according to claim 8, wherein:

the gate electrode is a polysilicon gate electrode; and the spacers are polysilicon spacers.

13. An integrated circuit chip including an integrated circuit comprising:

a substrate wafer having an active region doped with impurities of a first conductivity type;

a gate insulating layer formed on a surface of the substrate wafer;

a gate electrode formed on the gate insulating layer over the surface of the substrate wafer, the gate electrode having lateral sidewall surfaces;

a lightly doped source region and a lightly doped drain region, the lightly doped regions being doped with impurities of a second conductivity type opposite in conductivity to the first conductivity type and formed in the active region of the substrate wafer, self-aligned with the gate electrode;

an insulating dielectric layer formed on the lateral sidewall surfaces of the gate electrode;

spacers formed of a conductive material formed on the sidewall surfaces of the gate electrode, the spacers being electrically isolated from the gate electrode by the insulating dielectric layer and electrically isolated from the active region of the substrate wafer by the gate insulating layer;

a doped source region and doped drain region having a doping concentration higher than the lightly-doped source region and the lightly-doped drain region, the doped source region and the doped drain region being self-aligned with the gate electrode and the spacers;

an insulating layer formed on the substrate wafer overlying the gate electrode and the spacers, the insulating layer having a via extending through the insulating layer to a biasing spacer of the spacers;

a metal silicide layer formed on the gate electrode and formed on the spacers underlying the insulating layer, wherein the metal silicide layer formed on the gate electrode is separated by a minimum separation distance from the metal silicide layer formed on the spacers; and a conductor formed in the via extending through the insulating layer, the conductor for dynamically applying a biasing voltage to the biasing spacer for controlling voltage in the lightly-doped drain region.

14. An integrated circuit comprising:

a substrate wafer;

a transistor formed in and on the substrate wafer including a gate electrode formed on the substrate wafer, lightly-doped drain regions doped into the substrate wafer self-aligned with the gate electrode, sidewall spacers formed lateral to the gate electrode, an insulator interposed between the gate electrode and the sidewall spacers and electrically isolating the gate electrode from the sidewall spacers, and source and drain regions doped into the substrate wafer self-aligned with the gate electrode and sidewall spacers;

an insulating layer formed on the substrate wafer overlying the gate electrode and the sidewall spacers, the insulating layer having a via extending through the insulating layer to a biasing spacer of the spacers;

a metal silicide layer formed on the gate electrode and formed on the spacers underlying the insulating layer, wherein the metal silicide layer formed on the gate electrode is separated by a minimum separation distance from the metal silicide layer formed on the spacers; and a conductor formed in the via extending through the insulating layer, the conductor for dynamically applying a biasing voltage to the biasing space.

15. An integrated circuit comprising:

a substrate wafer;

a transistor formed in and on the substrate wafer including a gate electrode formed on the substrate wafer, lightly-doped drain regions doped into the substrate wafer self-aligned with the gate electrode, sidewall spacers formed lateral to the gate electrode, an insulator interposed between the gate electrode and the sidewall spacers and electrically isolating the gate electrode from the sidewall spacers, and source and drain regions doped into the substrate wafer self-aligned with the gate electrode and sidewall spacers;

an insulating layer formed on the substrate wafer overlying the gate electrode and the sidewall spacers, the insulating layer having a plurality of vias extending through the insulating layer to the spacers;

a metal silicide layer interposed between the insulating layer and the gate electrode and spacers, wherein the metal silicide layer interposed between the insulating layer and the gate electrode is separated by a minimum separation distance from the metal silicide layer interposed between the insulating layer and the spacer; and a plurality of conductors formed in the vias extending through the insulating layer, the conductors for dynamically applying biasing voltages to the spacers.

* * * * *

UNITED STATES PATENT AND TRADEMARK OFFICE
CERTIFICATE OF CORRECTION

PATENT NO. : 6,661,057 B1
DATED : December 9, 2003
INVENTOR(S) : Robert Dawson et al.

It is certified that error appears in the above-identified patent and that said Letters Patent is hereby corrected as shown below:

<u>Column 5,</u>
Line 16, after "38" insert -- (shown in Fig. 1C) --

Signed and Sealed this

Eighth Day of June, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,661,057 B1
DATED : December 9, 2003
INVENTOR(S) : Robert Dawson et al.

It is certified that error appears in the above-identified patent and that said Letters Patent is hereby corrected as shown below:

<u>Title page,</u>
Insert Item -- [73] Assignee: Advanced Micro Devices, Inc., Sunnyvale, California --

Signed and Sealed this

Third Day of August, 2004

JON W. DUDAS
*Acting Director of the United States Patent and Trademark Office*